(12) United States Patent
Ewer

(10) Patent No.: US 6,281,096 B1
(45) Date of Patent: Aug. 28, 2001

(54) CHIP SCALE PACKAGING PROCESS

(75) Inventor: Peter R. Ewer, Surrey (GB)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/556,213

(22) Filed: Apr. 21, 2000

Related U.S. Application Data

(60) Provisional application No. 60/130,540, filed on Apr. 22, 1999.

(51) Int. Cl.[7] .................................................. H01L 21/301
(52) U.S. Cl. .......................... 438/464; 438/465; 438/114
(58) Field of Search .................................... 438/464, 465, 438/460, 106, 110, 119, 128, FOR 387, 114

(56) References Cited

U.S. PATENT DOCUMENTS

| | | | |
|---|---|---|---|
| 4,104,786 | * | 8/1978 | Boah et al. . |
| 4,962,062 | | 10/1990 | Uchiyama et al. . |
| 5,151,388 | * | 9/1992 | Bakhit et al. . |
| 5,216,278 | | 6/1993 | Lin et al. . |
| 5,241,133 | | 8/1993 | Mullen, III et al. . |
| 5,273,940 | * | 12/1993 | Sanders . |
| 5,352,926 | | 10/1994 | Andrews . |
| 5,355,283 | | 10/1994 | Marrs et al. . |
| 5,467,253 | | 11/1995 | Heckman et al. . |
| 5,578,841 | * | 11/1996 | Vasquez et al. . |
| 5,583,376 | | 12/1996 | Sickler et al. . |
| 5,592,025 | | 1/1997 | Clark et al. . |
| 5,674,785 | | 10/1997 | Akram et al. . |
| 5,731,709 | | 3/1998 | Pastore et al. . |
| 5,734,201 | | 3/1998 | Djennas et al. . |
| 5,831,832 | | 11/1998 | Gillette et al. . |
| 5,844,168 | | 12/1998 | Schueller et al. . |
| 5,858,815 | | 1/1999 | Heo et al. . |
| 5,866,939 | | 2/1999 | Shin et al. . |
| 5,866,942 | | 2/1999 | Suzuki et al. . |
| 5,866,949 | | 2/1999 | Schueller . |
| 5,883,432 | | 3/1999 | Higashiguchi . |
| 5,883,438 | | 3/1999 | Kang . |
| 5,889,332 | | 3/1999 | Lawson et al. . |
| 5,892,273 | | 4/1999 | Iwasaki et al. . |
| 5,892,288 | | 4/1999 | Muraki et al. . |
| 6,087,719 | | 7/2000 | Tsunashima . |

OTHER PUBLICATIONS

Satoshi Tanigawa et al., The Resin Molded Chip Size Package (MCSP), publication date Oct. 2, 1995, 1995 IEEE/CPMT Int'l Electronics Manufacturing Tecnology Symposium, pp. 410–415.

Shunchi Matsuda et al., Simple–Structure, Generally Applicable Chip–Scale Package, publication date May 21, 1995, IEEE/CPMT Int'l Electronics Manufacturing Technology Symposium, pp. 218–223.

Pradeep Lall et al., Reliability Characterization of the SLICC Package, publication date May 28, 1996, 1996 IEEE Electronic components and Technology Conference, pp. 1202–1210.

Known Good die and Chip Scale Packaging, BPA (Technology & Management) Ltd., Sep. 1995, Report No. 588, pp. 111–112.

\* cited by examiner

*Primary Examiner*—George Fourson
*Assistant Examiner*—Thanh V Pham
(74) *Attorney, Agent, or Firm*—Ostrolenk, Faber, Gerb & Soffen, LLP

(57) ABSTRACT

A process for forming a true chip scale package comprising the sandwiching of a silicon wafer with a large number of identical die therein between top and bottom metal contact plates of the same size as the wafer. The sandwich is secured together as by soldering, and the die and contact plates are singulated in the form of a final chip scale package. The edge of each chip may have an insulation band formed thereon. Slots may be formed in the top contact to define, with the edge saw cuts, a separate contact area on each top contact.

14 Claims, 3 Drawing Sheets

CHIP SCALE PACKAGING PROCESS

CROSS REFERENCE TO RELATED APPLICATION

This application is based on and claims priority to U.S. Provisional patent application No. 60/130,540, filed Apr. 22, 1999.

BACKGROUND OF THE INVENTION

This invention relates to semiconductor device packages and the method of making such packages and more specifically relates to a chip-scale package and method of its manufacture.

Semiconductor device packages are well known for housing and protecting semiconductor die and for providing output connections to the die electrodes. Commonly, the semiconductor die are diced from a large parent wafer in which the die diffusions and metallizing are made in conventional wafer processing equipment. Such die may be diodes, field effect transistors, thyristors and the like. The die are fragile and the die surfaces must be protected from external environment. Further, convenient leads must be connected to the die electrodes for connection of the die in electrical circuits.

Commonly, such die are singulated from the wafer, as by sawing, and the bottom of the die is mounted on and connected to a portion of a lead frame which has identical sections to receive respective die. The top electrodes of the die are then commonly wire bonded to other portions of the lead frame, and a molded insulation housing is then formed over each lead frame section enclosing the die, and permitting lead portions of the lead frame to penetrate through the molded housing to be available for external connection.

It is desirable in many applications that packaged semiconductor devices be as small as possible to enable the mounting of many such devices on a support surface, such as a printed circuit board or an IMS (insulation-metal-substrate) support surface. Devices housed in the conventional manner occupy a much larger area than the area of the die which is housed. It would be very desirable to provide a semiconductor package which offers the same purposes of the conventional housing (of protecting the die and providing convenient external connection to the die electrodes), but which will occupy less surface area on a support surface.

BRIEF SUMMARY OF THE INVENTION

This invention provides a novel semiconductor die package of "chipscale". That is, the package of the present invention occupies very little more area than the actual area of the die. Thus, the invention reduces the package area (or "footprint") to close to the irreducible area of the die itself. The invention also provides a novel process for forming such chip-scale packages.

In accordance with the present invention semiconductor die are first processed in conventional wafer form. The completed semiconductor wafer is then bonded to a bottom contact wafer which is preferably made of a metal having thermal expansion characteristics similar to those of silicon, and, typically may be of molybdenum or tungsten. In this bonding process, the die bottom will have a bottom electrode of any suitable metal and is preferably overcoated with silver. Similarly, the base contact plate or wafer preferably has a metallized (silver) surface. Thus, the bottom surface of the silicon wafer and top surface of the base contact can be connected by diffusion bonding, soldering, eutectic bonding or the like.

The top contact wafer is similarly of a material having thermal expansion characteristics matched to that of silicon and its bottom surface can be metallized with silver, matching the metallized top surface of the electrode, or electrodes, on the die wafer surface.

The top contact is further processed so that the contact sections for each die location are pre-cut to define separate contact portions when the devices are singulated. The separated cuts are filled in with a suitable plastic such as an epoxy or polyamide. A bottom groove in the top contact is filled with a plastic filler also encloses respective device areas and defines a thinned area.

The top metal wafer and base metal wafer are then bonded to the silicon die wafer in a common bonding or soldering operation, with the top electrode contacts aligning with and contacting the contact areas of the respective die.

The bonded assembly is then saw-cut to singulate each die (in the conventional die streets) with its respective top and base contacts covering the full top and bottom die area. The die junctions are well protected and wire bond or pressure connections can be easily made to the top and bottom contacts.

DETAILED DESCRIPTION OF THE DRAWINGS

Figure 1:
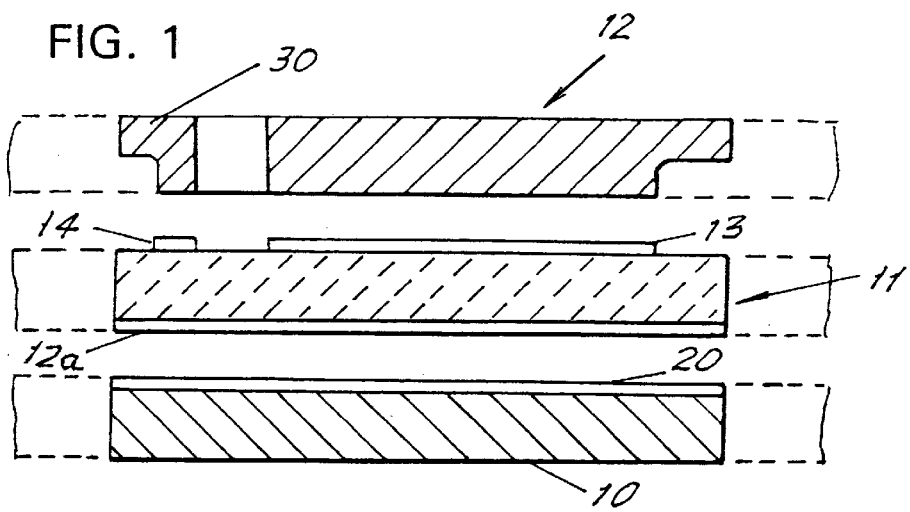
FIG. 1 is an exploded view of the top and bottom contacts and silicon die in wafer form.

Referring first to FIG. 1, there is shown one die section taken from an assembly of three wafers 10, 11 and 12. The wafers will have a much larger extent than that shown, and typically can contain hundreds or even thousands of die identical to that detailed in FIG. 1.

The die wafer 11 is a silicon wafer which has been conventionally processed to define a power MOSFET which may be that shown in U.S. Pat. No. 5,008,725. Thus, each of the die in the wafer 11 will have a bottom aluminum drain electrode 12a, a top source electrode 13 and a gate electrode 14. Each die will be separated from other die in wafer 11 by "streets" which provide a small area for saw cutting the die apart. Other devices could be used such as diode die, thyristor die and the like.

Wafer 10 in FIG. 1 is a base contact wafer and is preferably of a metal having expansion characteristics matched to those of silicon and may be molybdenum or tungsten or the like. The top surface of wafer 10 may have a silver metallized surface layer 20. The bottom surface of aluminum contact 12a may also be metallized with silver. Metals other than silver can be used.

Figure 2:
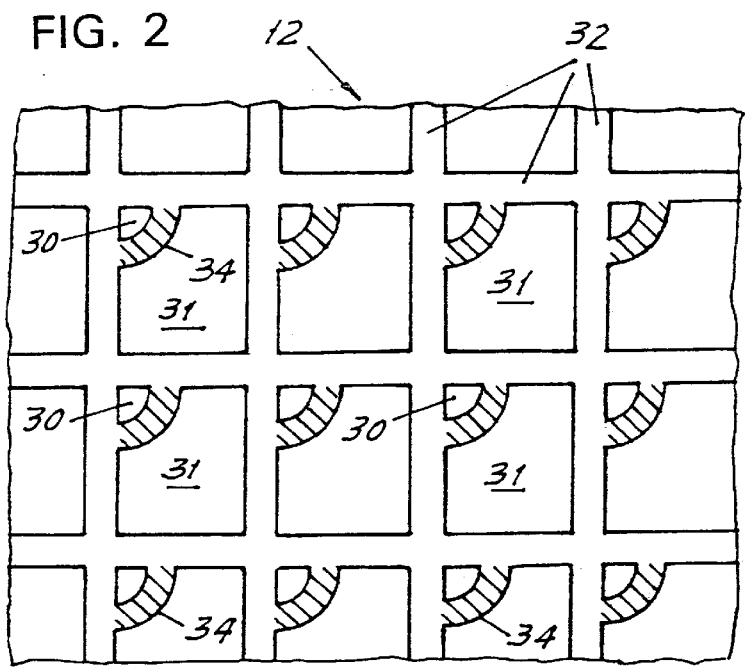
FIG. 2 is a bottom view of the top contact of FIG. 1 to show the pattern of machined cuts in the wafer for use with a MOSgated wafer die having source and gate electrodes on its top surface.

Wafer 12 in FIGS. 1 and 2 is also of an expansion metal such as molybdenum, but has a surface configuration which matches the top electrodes of the die in wafer 11. Thus, the gate contact portions 30 of wafer 12 are fully isolated from the source contact portions 31 (after the die are singulated). As best shown in FIG. 2, a series of intersecting grooves 32 are formed in the bottom of wafer 12 and define saw cut regions 33 (FIG. 3) for singulating the die. Thru-cut slots 34, shown shaded in FIG. 2 separate the gate contacts 30 from the source contacts 31 after singulation. Note that thru-cut slots 34 and shallower slots 32 are preferably back-filled with plastic (epoxy or polyamide) as shown in FIG. 3.

The bottom surface of wafer 12 will then have gate contact portions and source contact sections aligned with gate pad or electrode 14 and source electrode 13 respectively. These bottom surface portions may also be metallized with silver or the like.

Figure 3:
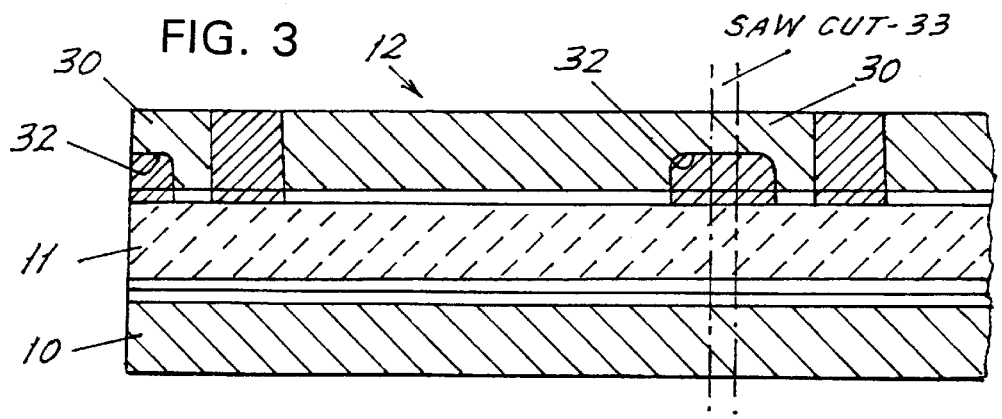
FIG. 3 shows the wafers of FIGS. 1 and 2 brought together for bonding.

FIG. 3 shows the assembly process of the three wafers 10, 11 and 12 of FIG. 1 in which the wafers 11 and 12 are carefully aligned with one another to match up the respective source and gate electrodes. Thereafter, wafers 10, 11 and 12 are simultaneously bonded together as by soldering, diffusion bonding, eutectic bonding or any other desired bonding process.

Figure 4:
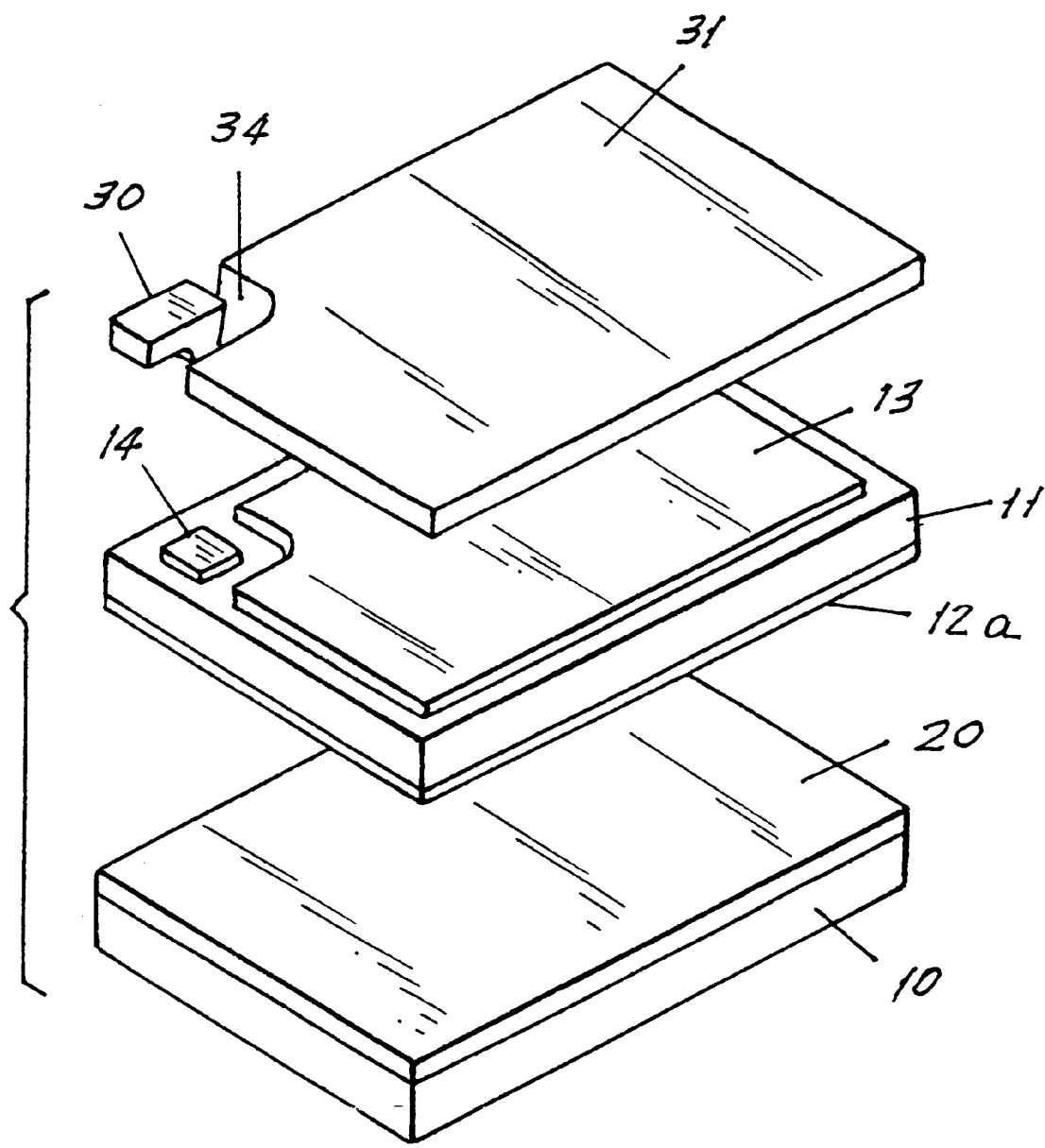
FIG. 4 is an exploded view of one of the bonded die of FIGS. 1 and 3 after singulation.

The bonded wafers are then diced to singulate the die, as by sawing through the centers of grooves 32. In some cases, after sawing, the exposed edges of die 11 may need extra protection by a small insulation coating. FIG. 4 shows a singulated die in exploded form.

Figure 5:
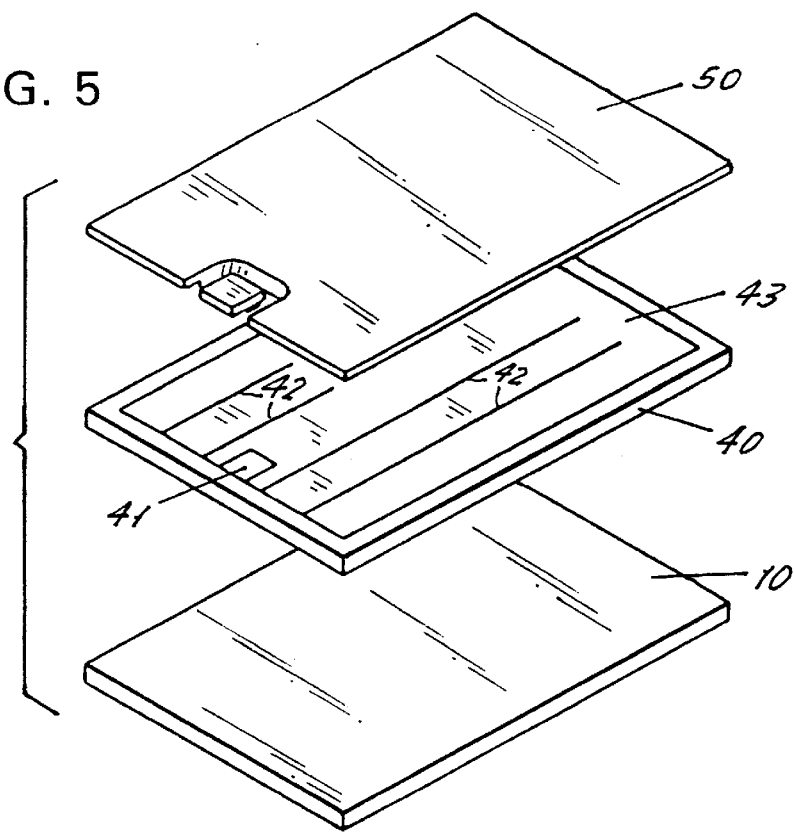
FIG. 5 is an exploded view of a die made in accordance with the invention, but having a different top electrode pattern.
Figure 6:
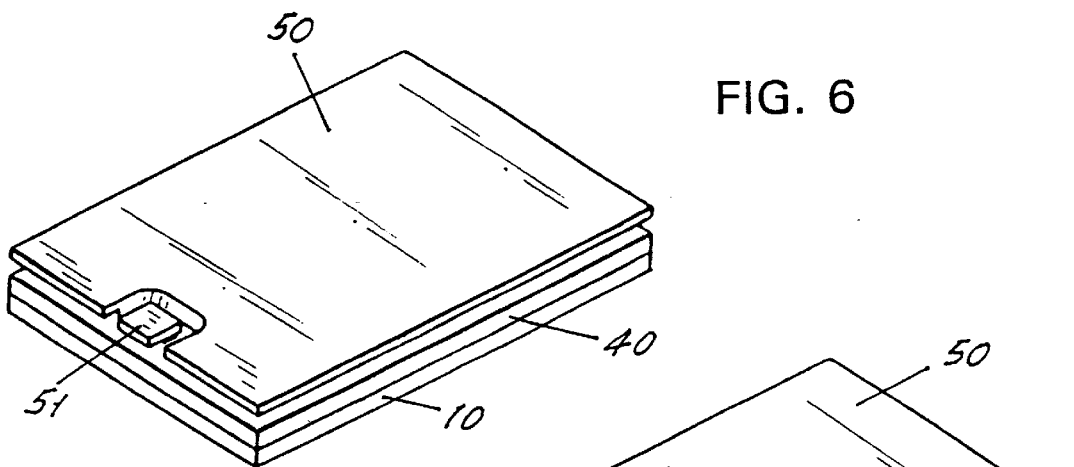
FIGS. 6 and 7 show the die of FIG. 5 in its assembled condition.
Figure 7:
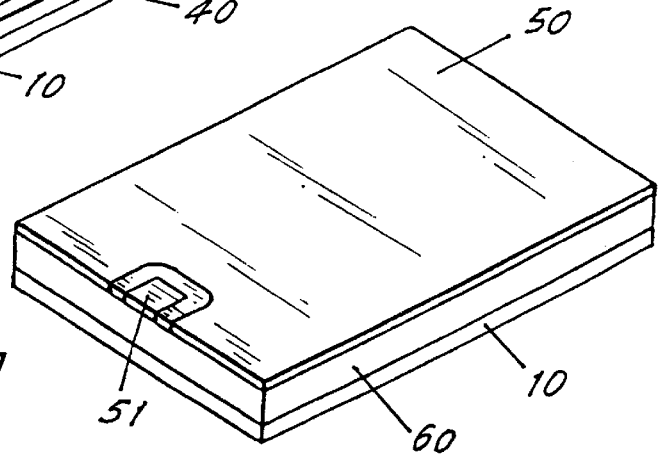

It will be apparent that the present invention is applicable to numerous types of device, including diodes, thyristors and FETs of all varieties. Suitable adjustments will be made in the contact wafers, depending on the shape of the electrodes in the die wafer. Thus, FIG. 5 shows a MOSFET die 40 with a different surface pattern in which a gate pad 41 has gate fingers 42 extending therefrom and insulated from a source electrode surface 43, as in U.S. Pat. No. 5,130,767. In this case, the upper source expansion contact 50 will have suitable undercuts (not shown) which avoid contact with gate pad 41 and its extending fingers 42. The top expansion contact wafer will then have separated gate portion 51 and source portion 50 which are otherwise the same as those of the embodiment of FIGS. 1 to 4. FIG. 7 shows a protective insulation filter 60 surrounding the edge of die 40 and insulating gate electrode 51 from source electrode 50.

While the upper and lower contact plates are shown as uniformly metallic, it should be noted that any conductive composition can be used either soldered or otherwise adhered to the die surfaces or otherwise deposited thereon.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. The process of manufacturing a semiconductor device package; said process comprising:

the formation of a plurality of adjacently located identical die with identical junction patterns in a single wafer of semiconductor material, said adjacently located die being separated by streets in said wafer;

forming a top solderable metal contact and a bottom solderable metal contact on each of said die within said wafer;

conductively affixing one surface of each of a first metal contact disk and a second metal contact disk over the full upper and full lower surfaces of said wafer respectively and in contact with said top and bottom solderable metal contacts respectively;

and thereafter slicing vertically through said first and second metal contact disks and said wafer in said streets of said wafer, thereby separating said plurality of die and their respective top and bottom contacts from one another.

2. The process of claim 1, wherein said wafer is formed of monocrystalline silicon and said first and second metal contact disks are formed of a metal having thermal expansion characteristics of said silicon wafer.

3. The process of claim 1, wherein said first and second metal contact disks are formed of a metal having thermal expansion characteristics of molybdenum.

4. The process of claim 1, wherein said wafer and first and second metal contact disks are separated by a saw cut process.

5. The process of claim 3, wherein said wafer and first and second metal contact disks are separated by a saw cut process.

6. The process of claim 1, which further includes the application of an insulation filler around an edge of each of said die.

7. The process of claim 5, which further includes the application of an insulation filler around an edge of each of said die.

8. The process of claim 1 wherein said first metal contact disk has a plurality of slots therein which extend between two of the trenches around each of said die, whereby, when said die are separated, the first metal contact disk of said die is separated into at least two segments by said slots.

9. The process of claim 8 wherein said plurality of slots are filled with an insulation compound.

10. The process of claim 2 wherein said first metal contact has a plurality of slots therein which extend between two of the trenches around each of said die, whereby, when said die are separated, the first metal contact disk of said die is separated into at least two segments by said slots.

11. The process of claim 3 wherein said first metal contact disk has a plurality of slots therein which extend between two of the trenches around each of said die, whereby, when said die are separated, the first metal contact disk of said die is separated into at least two segments by said slots.

12. The process of claim 6 wherein said first metal contact disk has a plurality of slots therein which extend between two of the trenches around each of said die, whereby, when said die are separated, the first metal contact of said die is separated into at least two segments by said slots.

13. The process of claim 1, wherein at least one of said metal contact plates is made from a metal in a group consisting of molybdenum and tungsten.

14. The process of claim 1, further comprising selecting a metal for forming said first and said second metal contact disks, said metal and said wafer of semiconductor material having about equal thermal expansion coefficients.

* * * * *